(12) United States Patent
Macika et al.

(10) Patent No.: US 7,518,862 B1
(45) Date of Patent: Apr. 14, 2009

(54) WAGERING GAME TERMINAL WITH INTERNAL COOLING

(75) Inventors: Raymond E. Macika, Chicago, IL (US); Timothy C. Loose, Chicago, IL (US)

(73) Assignee: WMS Gaming Inc., Waukegan, IL (US)

( * ) Notice: Subject to any disclaimer, the term of this patent is extended or adjusted under 35 U.S.C. 154(b) by 347 days.

(21) Appl. No.: 11/044,804

(22) Filed: Jan. 27, 2005

(51) Int. Cl.
*H05K 7/20* (2006.01)
(52) U.S. Cl. .................. 361/688; 361/752; 361/760
(58) Field of Classification Search ............. 361/724, 361/725, 680–683; 463/46, 20; 174/138 D; 312/223
See application file for complete search history.

(56) References Cited

U.S. PATENT DOCUMENTS

| | | | |
|---|---|---|---|
| 5,828,549 A * | 10/1998 | Gandre et al. ............ 361/695 |
| 6,108,731 A * | 8/2000 | Suzuki et al. ............. 710/301 |
| 6,117,009 A * | 9/2000 | Yoseloff .................. 463/20 |
| 6,180,874 B1 * | 1/2001 | Brezina et al. ............ 174/16.3 |
| 6,343,013 B1 * | 1/2002 | Chen ..................... 361/695 |
| 6,359,781 B1 * | 3/2002 | Hoss et al. ............... 361/687 |
| 6,377,463 B1 * | 4/2002 | Shah ..................... 361/720 |
| 7,056,144 B2 * | 6/2006 | Barsun et al. ............ 439/362 |
| 7,106,586 B2 * | 9/2006 | Yu et al. ................. 361/690 |
| 2002/0067595 A1 * | 6/2002 | Ogawa ................... 361/687 |
| 2004/0075982 A1 * | 4/2004 | Kim et al. ............... 361/687 |
| 2005/0215325 A1 * | 9/2005 | Nguyen et al. ............ 463/46 |
| 2005/0219825 A1 * | 10/2005 | Campini et al. ........... 361/719 |

* cited by examiner

*Primary Examiner*—Hung S Bui
(74) *Attorney, Agent, or Firm*—Nixon Peabody LLP (57) ABSTRACT

Method and system are disclosed for cooling microprocessors and other data processing circuits in wagering game terminals. The method and system of the invention allow a wagering game terminal to be retrofitted with a cooling system for a different microprocessor-based application while making few or no changes to the wagering game terminal. The retrofitted microprocessor cooling system provides greater thermal dissipation, ensuring that the microprocessor will operate within the specified temperature range. The cooling system also takes up less space and has fewer components, resulting in a lower cost overall. And since few or no changes are made to the wagering game terminal, existing inventory of equipment and components may be used.

17 Claims, 6 Drawing Sheets

WAGERING GAME TERMINAL WITH INTERNAL COOLING

FIELD OF THE INVENTION

The present invention relates generally to wagering game terminals and, more particularly, to a wagering game terminal with an improved internal cooling method and system.

BACKGROUND OF THE INVENTION

Wagering game terminals, such as slot machines, video poker machines, and the like, have been a cornerstone of the gaming industry for years. The popularity of such terminals among players generally depends on the perceived likelihood of winning money at the terminal and the intrinsic entertainment value of the terminal relative to other available gaming options. Where the available gaming options include a number of competing terminals and the expectation of winning each terminal is roughly the same (or believed to be the same), players are most likely to be attracted to the more entertaining and exciting terminal. As a result, wagering game terminal operators strive to employ the most entertaining and exciting terminals available, since such terminals attract frequent play and provide increased profitability for the operators. Consequently, wagering game terminal have added increasingly advanced and sophisticated features over the years in terms of their operational and display capabilities.

Due to the advanced features coupled with rich graphics, the data processing capacity required for wagering game terminals has also increased over the years. Most wagering game terminals now require microprocessors and other data processing circuits that run at very high clock speeds. The high clock speeds cause the microprocessors to generate large amounts of heat to the extent that some type of cooling system is usually required to maintain the microprocessors within specified operating temperatures. This trend is likely to continue as new generations of microprocessors are designed that run at increasingly faster clock speeds. Thus, microprocessor cooling systems that provided sufficient cooling for a previous generation of microprocessors may become inadequate for the next generation. As a result, equipment and components that were purchased for the earlier generations of microprocessors may suddenly become obsolete, and additional costs may need to be incurred to acquire new parts.

Moreover, while other microprocessor-based applications have seen a number of advancements in cooling systems, these advancements have not always been transferable to wagering game terminals. This is due partly to the fact that wagering game terminals are required to follow certain regulatory standards, whereas other microprocessor-based applications may not. Personal computer manufacturers, for example, often design their hardware to be modular in order to keep up with one or more industry-wide practices, such as "Socket 7" for microprocessors. Manufacturers of wagering game terminals, on the other hand, are often required to maintain the same hardware design for a certain period of time, even where microprocessors are concerned. Consequently, microprocessor cooling systems for personal computers have not always been compatible with wagering game terminal hardware.

Accordingly, what is needed is a way to develop improvements in microprocessor cooling systems for wagering game terminals. It would be particularly useful to be able to develop these improvements in a way that makes use of existing equipment and components.

SUMMARY OF THE INVENTION

The present invention is directed to an improved method and system for cooling the microprocessors and other data processing circuits in wagering game terminals. The method and system of the invention allow a wagering game terminal to be retrofitted with a cooling system for a different microprocessor-based application while making few or no changes to the wagering game terminal. The retrofitted microprocessor cooling system provides greater thermal dissipation, ensuring that the microprocessor will operate within the specified temperature range. The cooling system also takes up less space and has fewer components, resulting in a lower cost overall. And since few or no changes are made to the wagering game terminal, existing inventory of equipment and components may be used.

In general, in one aspect, the invention is directed to a microprocessor cooling system for a wagering game terminal, the wagering game terminal having a main board and a processor board. The microprocessor cooling system comprises support members for maintaining appropriate spacing between the main board and the processor board. The microprocessor cooling system further comprises a single heat sink having a plurality of fins and mounted to the processor board, the heat sink in thermal contact with a microprocessor on the processor board and supported by the support members for spacing the heat sink apart from the processor board. A fan is present for creating air flow over the heat sink, the fan causing air to directly impinge the heat sink.

In general, in another aspect, the invention is directed to a method of retrofitting a first microprocessor cooling system with a second microprocessor cooling system in a wagering game terminal. The method comprises the steps of removing a first heat sink in the first microprocessor cooling system by removing screws aligned within through-holes in a printed circuit board on which the first microprocessor cooling system is mounted. The method further comprises the steps of forming holes in a bottom surface of a second heat sink in the second microprocessor cooling system, the holes matching the through-holes in the printed circuit board. A plurality of standoffs is attached to the second heat sink via the holes in the bottom surface of the second heat sink, the standoffs for maintaining a predetermined distance between the second heat sink and a microprocessor mounted on the printed circuit board, and a thermally conductive layer is added between the second heat sink and the microprocessor. Thermal contact between the microprocessor and the second heat sink is created by coupling the standoffs to the printed circuit board on which the microprocessor is mounted, the thermal contact including the thermally conductive layer.

In general, in still another aspect, the invention is directed to a wagering game terminal. The wagering game terminal comprises a wager input device for accepting a wager from a player at the wagering game terminal and a display unit for displaying a wagering game of the wagering game terminal, the wagering game having an outcome that is randomly selected from a plurality of outcomes. The wagering game terminal further comprises a microprocessor for controlling the wager input device and a microprocessor cooling system for cooling the microprocessor, the microprocessor cooling system including a heat sink that is in thermal contact with the microprocessor and a fan that impinges air directly on the heat sink.

The above summary of the present invention is not intended to represent each embodiment, or every aspect, of the present invention. The detailed description and figures will describe many of the embodiments and aspects of the present invention.

BRIEF DESCRIPTION OF THE DRAWINGS

The foregoing and other advantages of the invention will become apparent upon reading the following detailed description and upon reference to the drawings, wherein.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DESCRIPTION OF ILLUSTRATIVE
EMBODIMENTS

Figure 1:
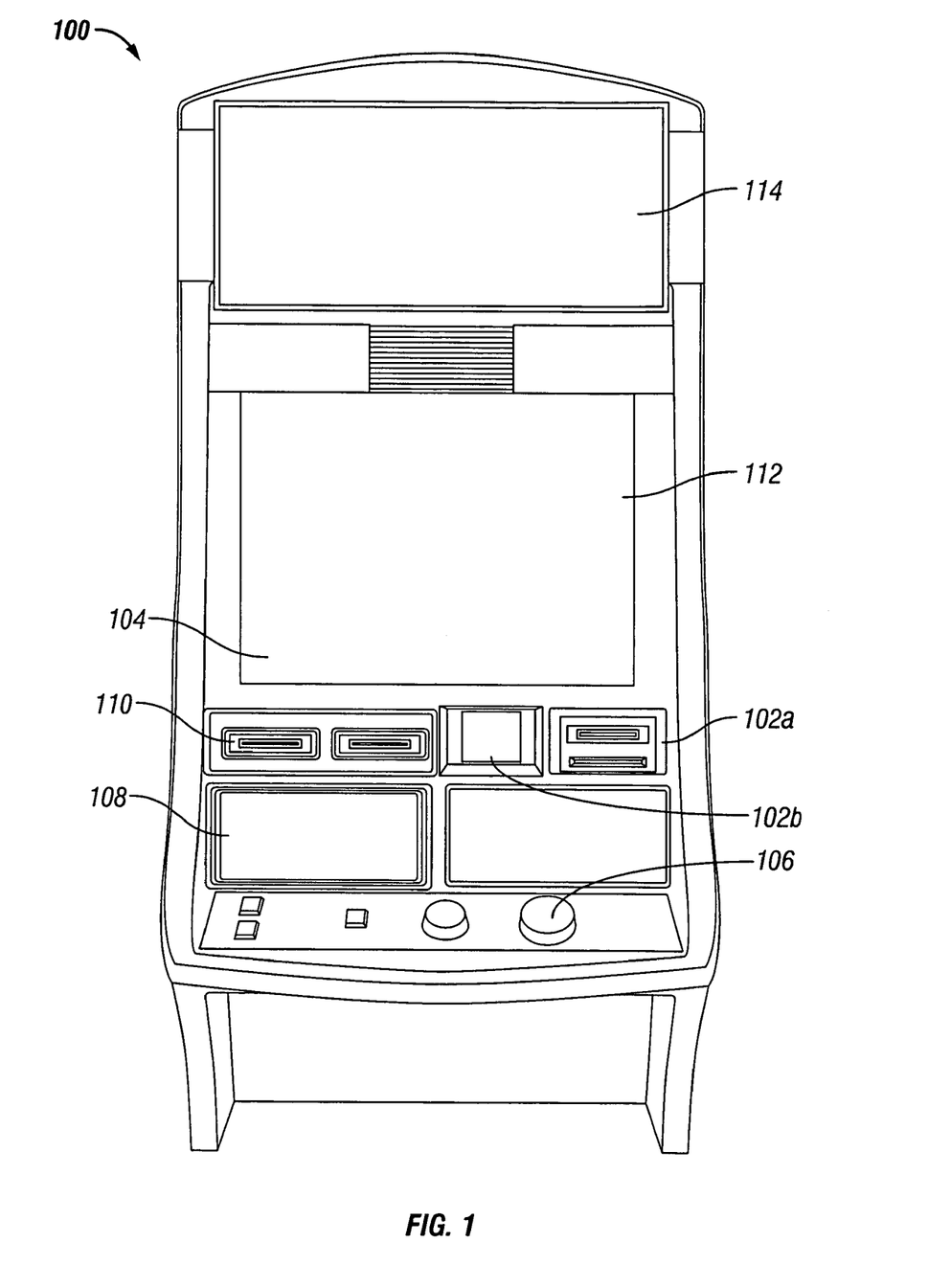
FIG. 1 illustrates a perspective view of a wagering game terminal according to one embodiment of the invention.

As alluded to above, embodiments of the invention provide an improved method and system for cooling the microprocessors and other data processing circuits in wagering game terminals. FIG. 1 shows a perspective view of an exemplary wagering game terminal 100 according to embodiments of the invention. The wagering game terminal 100 may be operated as a stand-alone terminal, or it may be connected to a network of wagering game terminals. Further, the wagering game terminal 100 may be any type of wagering game terminal and may have varying structures and methods of operation. For example, the wagering game terminal 100 may be a mechanical wagering game terminal configured to play mechanical slots, or it may be an electromechanical or electrical wagering game terminal configured to play a video casino game, such as blackjack, slots, keno, poker, etc. In the example shown, the wagering game terminal 100 is a video slot machine.

As shown, the wagering game terminal 100 includes input devices, such as a wager acceptor 102 (shown as a card wager acceptor 102a and a cash wager accepter 102b), a touch screen 104, a push-button panel 106, a payout mechanism 108, and an information reader 110. The wagering game terminal 100 further includes a main display 112 for displaying information about the basic wagering game and, in some embodiments, a secondary display 114 for displaying a pay table and/or game-related information or other entertainment features. While these typical components found in the wagering game terminal 100 are described briefly below, it should be understood that numerous other elements may exist and may be used in any number of combinations to create variations of the wagering game terminal 100.

The wager acceptors 102a and 102b may be provided in many forms, individually or in combination. For example, the cash wager acceptor 102a may include a coin slot acceptor or a note acceptor to input value to the wagering game terminal 100. The card wager acceptor 102b may include a card-reading device for reading a card that has a recorded monetary value with which it is associated. The card wager acceptor 102b may also receive a card that authorizes access to a central account that can transfer money to the wagering game terminal 100.

The payout mechanism 108 performs the reverse function of the wager acceptors 102a and 102b. For example, the payout mechanism 108 may include a coin dispenser or a note dispenser to dispense money or tokens from the wagering game terminal 100. The payout mechanism 108 may also be adapted to receive a card that authorizes the wagering game terminal 100 to transfer credits from the wagering game terminal 100 to a central account.

The push button panel 106 is typically offered, in addition to the touch screen 104, to provide players with an option on making their game selections. Alternatively, the push button panel 106 may facilitate player input needed for certain aspects of operating the game, while the touch screen 104 facilitates player input needed for other aspects of operating the game.

The outcome of the basic wagering game is displayed to the player on the main display 112. The main display 112 may take a variety of forms, including a cathode ray tube (CRT), a high resolution LCD, a plasma display, LED, or any other type of video display suitable for use in the wagering game terminal 100. As shown here, the main display 112 also includes the touch screen 104 overlaying the entire display (or a portion thereof) to allow players to make game-related selections. Alternatively, the wagering game terminal 100 may include a number of mechanical reels that display the game outcome.

In some embodiments, the information reader 110 is a card reader that allows for identification of a player by reading a card with information indicating the player's identity. Currently, identification is used by casinos for rewarding certain players with complimentary services or special offers. For example, a player may be enrolled in the gaming establishment's players' club and may be awarded certain complimentary services as that player collects points in his or her player-tracking account. The player inserts his or her card into the player-identification card reader 110, which allows the casino's computers to register that player's wagering at the wagering game terminal 100. Then, the wagering game terminal 100 may use the secondary display 114 for providing the player with information about his or her account or other player-specific information. Also, in some embodiments, the information reader 110 may be used to restore game status information for a previous gaming session that the player had played.

Figure 2:
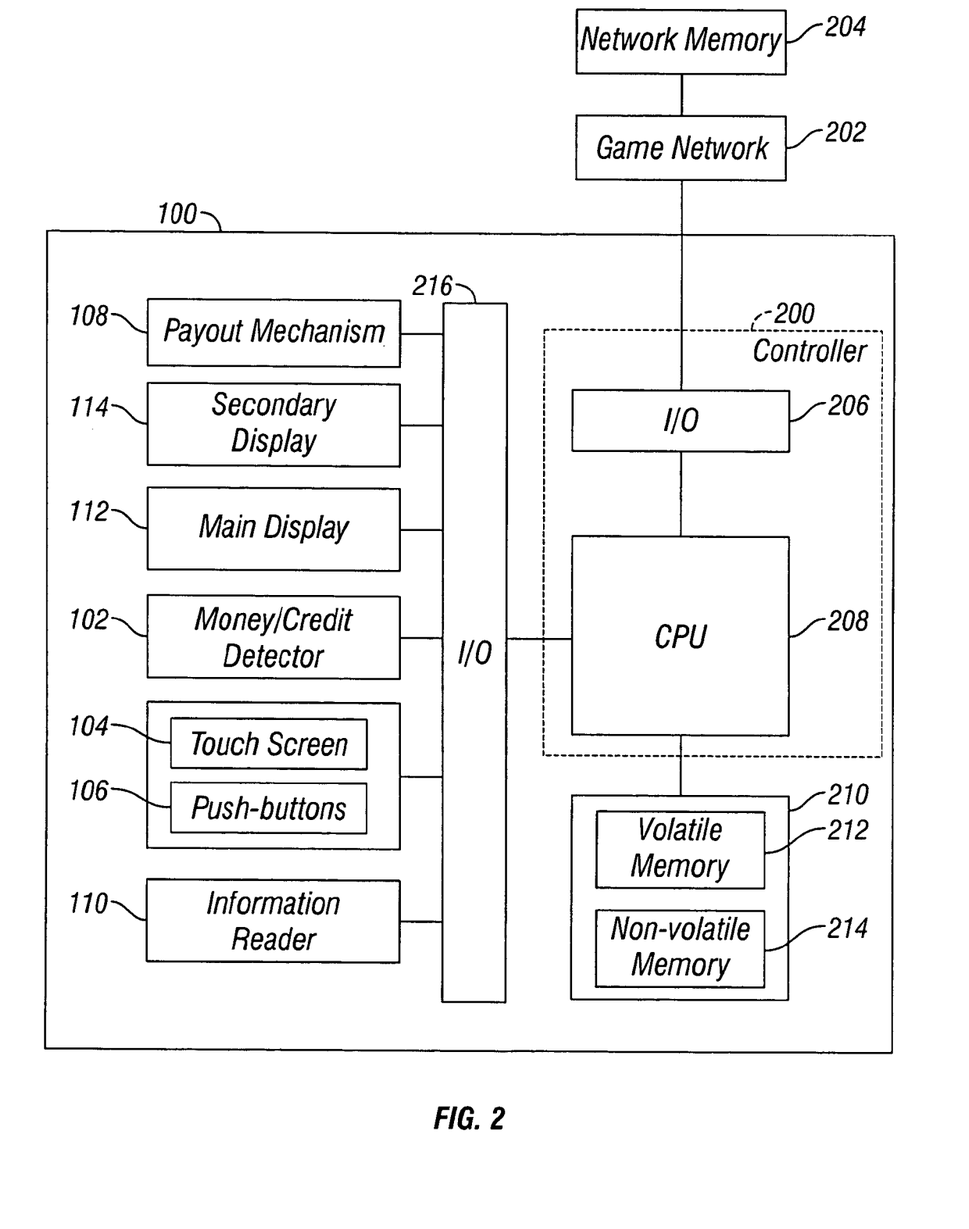
FIG. 2 illustrates the wagering game terminal of FIG. 1 in more detail.

As shown in FIG. 2, the wagering game terminal 100 and associated wagering game control system is capable of executing wagering games on or through a controller 200. The controller 200, as used herein, comprises any combination of hardware, software, and/or firmware that may be disposed or resident inside and/or outside of the wagering game terminal 100 or like machine which may communicate with and/or control the transfer of data between the wagering game terminal 100 and a bus, another computer, processor, or device, and/or a service and/or a network. Such a network is shown at 202 and may include, but is not limited to, a peer-to-peer, client/server, master/slave, star, ring, bus, or other network architecture wherein at least one processing device (e.g., computer) is linked to at least one other processing device. A network memory 204 is connected to the network 202 for storing data and/or information transferred over the network 202, including game status information.

The controller 200 may comprise the I/O circuits 206 and a CPU 208. In other embodiments, the CPU 208 may be housed outside of the controller 200, and a different processor may be housed within the controller 200. The controller 200, as used herein, may comprise multiple CPUs 208. In one implementation, each wagering game terminal 100 comprises, or is connected to, a controller 200 enabling each wagering game terminal 100 to transmit and/or receive signals, preferably both, in a peer-to-peer arrangement. In another example, the controller 200 may be adapted to facilitate communication and/or data transfer for one or more wagering game terminals 100 in a client/server or centralized arrangement. In one aspect, shown in FIG. 2, the controller 200 may connect the wagering game terminal 100 via a conventional I/O port and communication path (e.g., serial, parallel, IR, RC, 10bT, etc.) to the game network 202, which may include, for example, other wagering game terminals connected together in the network 202.

To provide the wagering game functions, the controller 200 executes a game program that generates a randomly selected game outcome. The controller 200 is also coupled to or includes a local memory 210. The local memory 210 may be in the form of one or more volatile memories 212 (e.g., a random-access memory (RAM)) and one or more non-volatile memories 214 (e.g., an EEPROM). Communication between the peripheral components of the wagering game terminal 100 and the controller 200 is controlled by the controller 200 through input/output (I/O) circuits 216.

The different functions of the wagering game terminal described above are typically implemented in hardware as integrated circuits on one or more printed circuit (PC) boards. As mentioned above, the hardware for wagering game terminals are not allowed to change as often as other microprocessor-based applications, such as personal computers. Thus, microprocessor cooling systems such as fan-heat sink combination units that latch or clip onto the microprocessors, or to their sockets, are not always available to wagering game terminals. Consequently, wagering game terminal manufacturers often must come up with their own designs for microprocessor cooling systems.

Figure 3A:
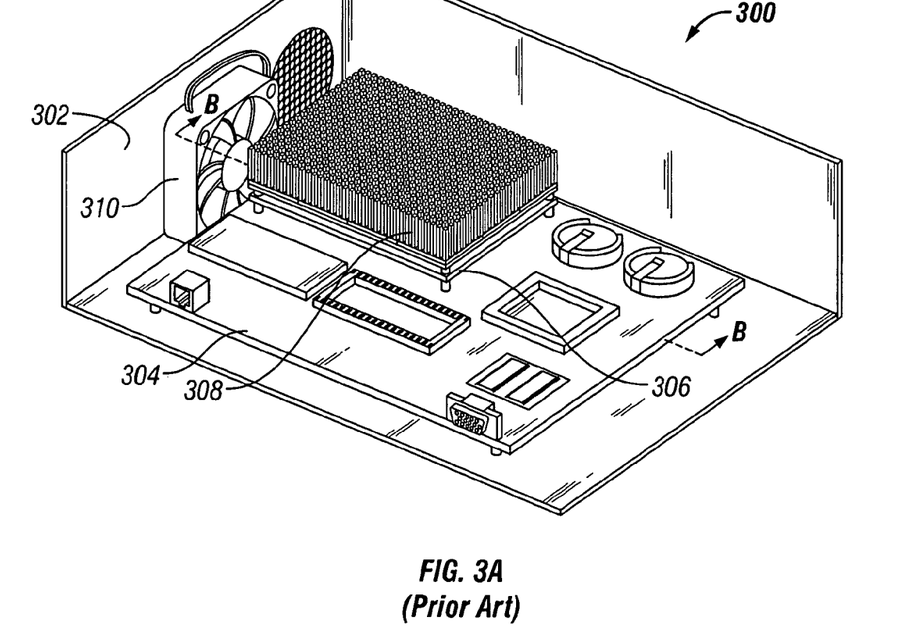
FIGS. 3A-3B illustrate a prior art microprocessor cooling system used within a wagering game terminal.
Figure 3B:
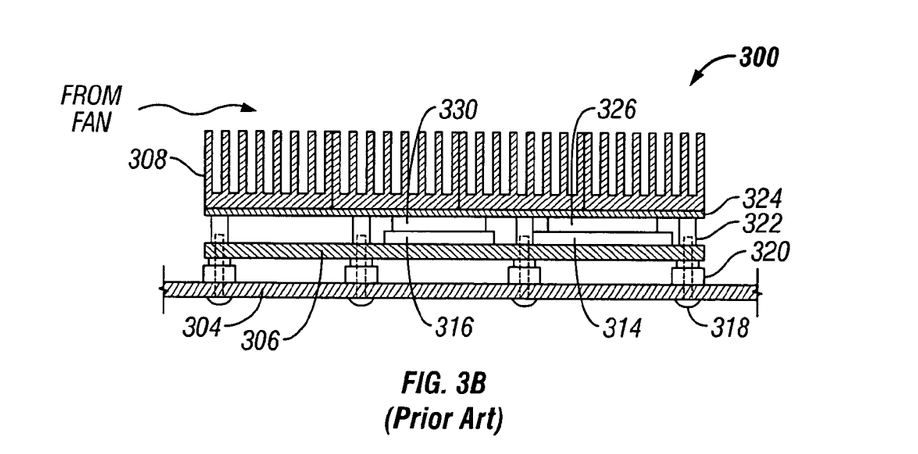

An example of a prior art microprocessor cooling system 300 for a wagering game terminal is shown in FIGS. 3A-3B. It should be noted that FIGS. 3A-3B as well as the other drawings are provided for illustrative purposes only and are not intended to be a blue print or drawn to any particular scale. As can be seen in FIG. 3A, the wagering game terminal hardware includes a metallic casing or housing 302 that houses and protects PC boards 304 and 306. Here, the top, front, and right side of the housing 302 are omitted for easier viewing. The PC boards 304 and 306 include a main board 304 and a separate processor board 306. The main board 304 supports the overall operation of the wagering game terminal, and the processor board 306 provides one or more data processing functions for the wagering game terminal. More precisely, a microprocessor 314 (see FIG. 3B) on the processor board 306 provides the one or more data processing functions for the wagering game terminal.

To dissipate the heat generated by the microprocessor 314 and other integrated circuits, the prior art microprocessor cooling system 300 used an array of heat sinks, one of which is labeled as 308. Three rows of heat sinks 308 are in thermal contact with the microprocessor 314, each row having four heat sinks for a total of 12 heat sinks. The heat sinks 308 are of the fin variety where a series of fins protrude upwardly from a planar base. Heat from the microprocessor 314 is conducted through the planar base and transferred into the air by the fins through convection. The heat is then carried away by air flow across the array of heat sinks 308 from a fan 310 affixed to the housing 302.

FIG. 3B shows the prior art microprocessor cooling system 300 in more detail. As can be seen, the microprocessor 314 is mounted directly on the processor board 306 so that no socket is required. Also mounted on the processor board 306 are a chipset controller 316 and various other components (e.g., capacitors, resistors, memory, etc.) that are omitted here for the sake of simplicity. The processor board 306 is mounted to the main board 304 via screws 318 that extend from the bottom of the main board 304 through holes in the main and processor boards 304 and 306 (see dotted lines). Although difficult to observe here, the screws 318 are located at each of the four corners (better seen in FIG. 4C) of the processor board 306 and two interior locations in the processor board 306. Spacers 320, which may be nuts, sleeves, washers, and/or other, are disposed over the screws 318 between the processor board 306 and the main board 304 to keep the two boards physically separated.

A standoff 322 is connected to each screw 318 between the processor board 306 and an aluminum heat-spreader plate 324 to keep them spaced apart. The standoff 322 is internally threaded and is press-fitted into the aluminum heat-spreader plate 324. The heat sinks 308 are mounted on top of the heat-spreader plate 324 and are adhered thereto with a thermally conductive adhesive layer (not expressly shown). A thermal contact layer 326 is sandwiched between the microprocessor 314 and the aluminum heat-spreader plate 324 to facilitate heat transfer from the microprocessor 314 to the heat-spreader plate 324. A similar thermal contact layer 330 is also sandwiched between the chipset controller 316 and the aluminum heat-spreader plate 324.

While the microprocessor cooling system 300 of the prior art provides sufficient heat dissipation for some microprocessors, the dissipation has been found to be inadequate for certain specific microprocessors, such as Intel Pentium III™ microprocessors running at 700 MHz. The heat dissipation is even poorer for newer generations of microprocessors running at faster speeds. Other drawbacks include a large profile, high component count, and complex assembly.

Figure 4A:
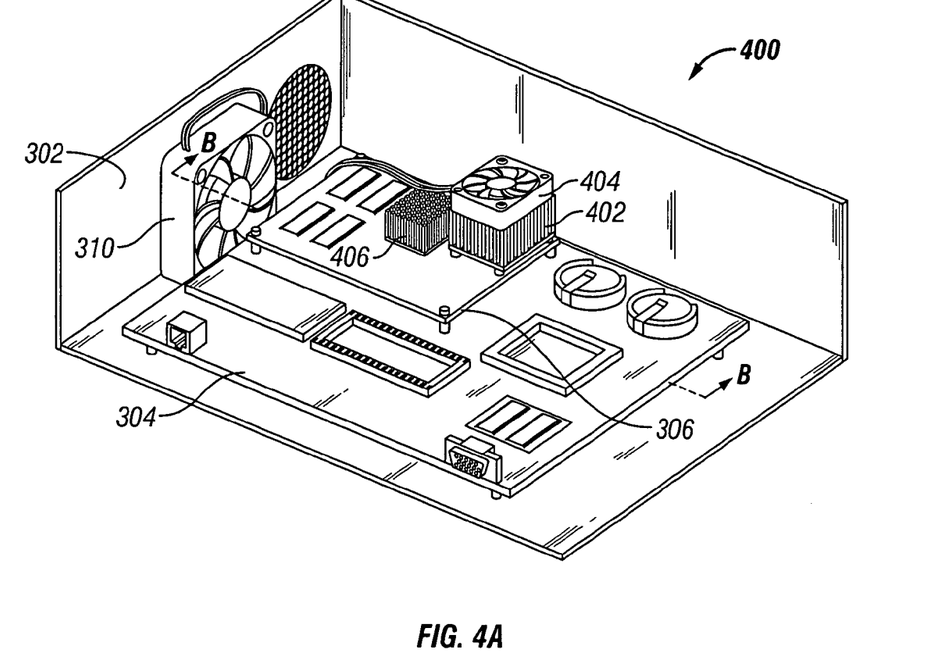
FIGS. 4A-4C illustrate a microprocessor cooling system according to one embodiment of the invention.
Figure 4B:
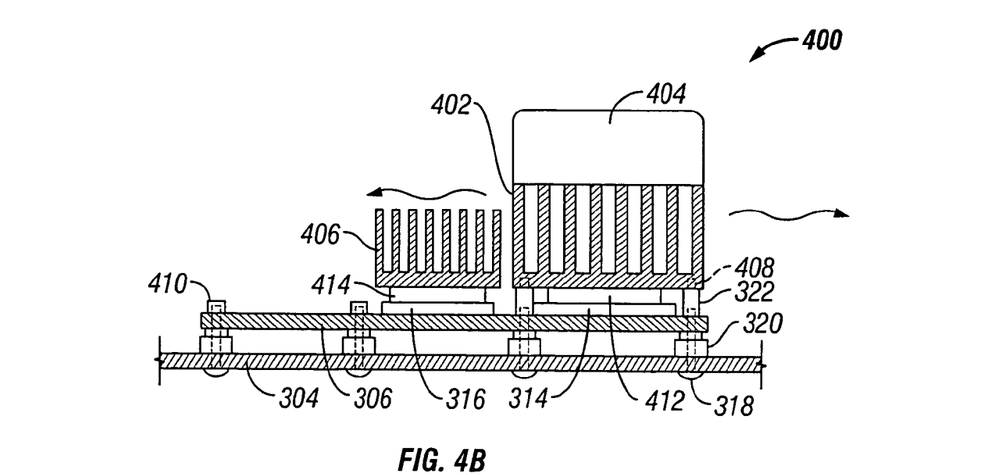
Figure 4C:
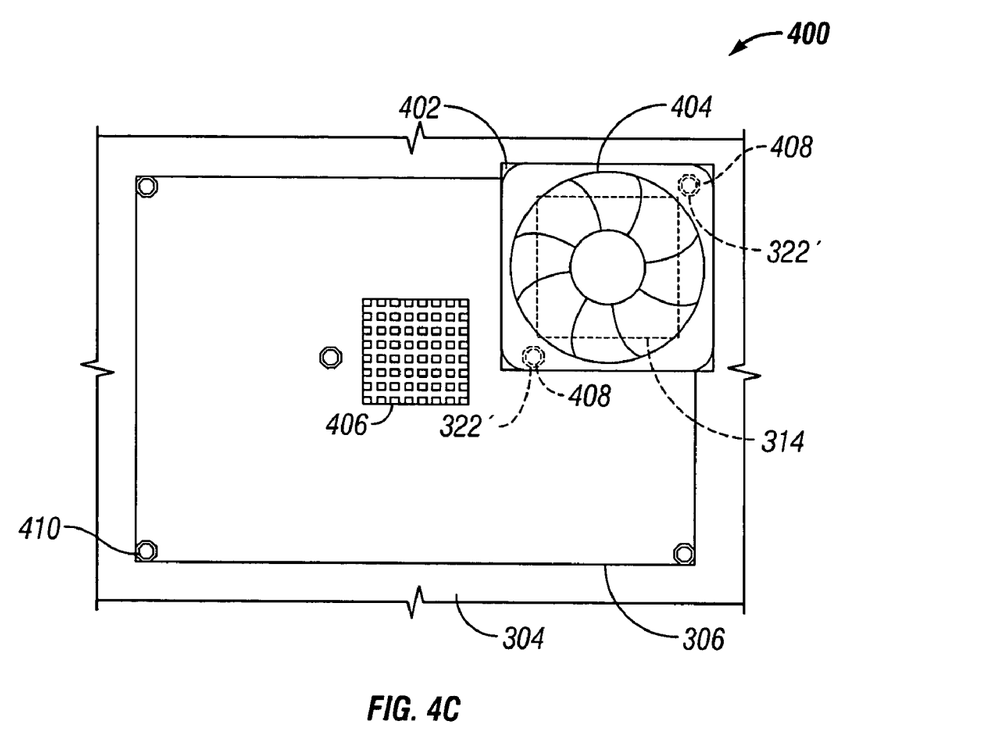

FIGS. 4A-4C illustrate the same wagering game terminal hardware shown in FIGS. 3A-3B, but retrofitted for an improved microprocessor cooling system 400 according to embodiments of the invention. As can be seen in FIG. 4A, the array of heat sinks 308 and the aluminum heat-spreader plate 324 in FIGS. 3A and 3B has been replaced with a single, unitary heat sink 402 having a fan 404 attached to the top of the heat sink. The fan-heat sink combination 402 and 404 is then mounted directly to the microprocessor 314 as opposed to an intermediate structure like the aluminum heat-spreader plate 324. Such direct thermal contact has been found to provide better heat dissipation for the microprocessor 314 than the prior art cooling system 300 described above.

One reason for this improvement is that the direct thermal contact creates at least two fewer thermal interfaces due to the removal of the heat-spreader plate 324. The thermal interfaces create higher thermal resistance, which increases the overall temperature difference between the heat source and the thermal reservoir (i.e., between the microprocessor 314 and the air). Another reason for this improvement is that the fan 404 causes impingement air flow on the heat sink 402. Such impingement air flow can create a higher heat-transfer coefficient, meaning that the waste heat can be more readily transferred to the air. Depending on the amount of heat that is transferred to the air and the temperature requirement of the microprocessor 314, the fan 310 mounted on the housing 302 may or may not be needed.

Where necessary, a second heat sink 406 may also be mounted directly to the chipset controller 316 for dissipating heat from the chipset controller 316. Since the chipset controller 316 is located near (e.g., within a few millimeters) the microprocessor 314, a sufficient amount of air (indicated by wavy line) from the fan 404 blows across the second heat sink 406 to cool the chipset controller 316 without requiring a second fan for the second heat sink 406.

Other advantages of the improved microprocessor cooling system 400 include having fewer parts than the microprocessor cooling system 300, taking up less space, and being easier to assemble. Moreover, few or no changes need to be made to the hardware of the wagering game terminal in order to use the improved microprocessor cooling system 400.

In one embodiment, shown in FIG. 4B, holes 408 are formed (e.g., drilled) in the bottom surface of the heat sink 402 that correspond to the positions of two standoffs 322' adjacent to the microprocessor 314. The standoffs 322' are located in the same location as the two corresponding standoffs 322 of FIG. 3B. In one embodiment, the standoffs 322' have a female end for receiving the screws 318 and a male end for mounting the heat sink 402. The heat sink 402 may then be mounted, via the holes 408, onto the male end of the standoffs 322'. A thermal contact layer 412 is sandwiched between the bottom of the heat sink 402 and the microprocessor 314 to facilitate heat transfer. A separate thermal contact layer 414 is sandwiched between the bottom of the second heat sink 406 and the chipset controller 316. The thermal contact layer 414 may be different from the thermal contact layer 412, or it may be the same.

Preferably, the heat sink 402 and the fan 404 are of the type normally sold as a single unit where the fan 404 is already attached to the heat sink 402 so that no further assembly is required. Fan-heat sink combinations of this type typically come with a latch or clip that allows the unit to be latched or clipped to the socket of the microprocessor. However, since the latch or clip is not needed for the microprocessor cooling system 400 (recall that there is no socket), it may be removed and discarded if desired.

FIG. 4C shows a plan view of the improved microprocessor cooling system 400 of the present invention. As can be seen, the heat sink 402 and fan 404 are mounted over the microprocessor 314 via the two standoffs 322' that are adjacent to the microprocessor 314. Note that the spacing between the holes 408 in the bottom surface of the heat sink 402 is substantially the same as the two standoffs 322' that are adjacent to the microprocessor 314. The screws 318 that have no standoffs 322' connected may be suitably terminated or capped with nuts 410 and the like. The heat sink 406 of the chipset controller 316, by virtue of being near the heat sink 402 of the microprocessor 314, benefits from the cooling air currents of the fan 404. The entire arrangement takes up less space and has fewer parts than the microprocessor cooling system 300 of the prior art while providing greater heat dissipation.

Figure 5:
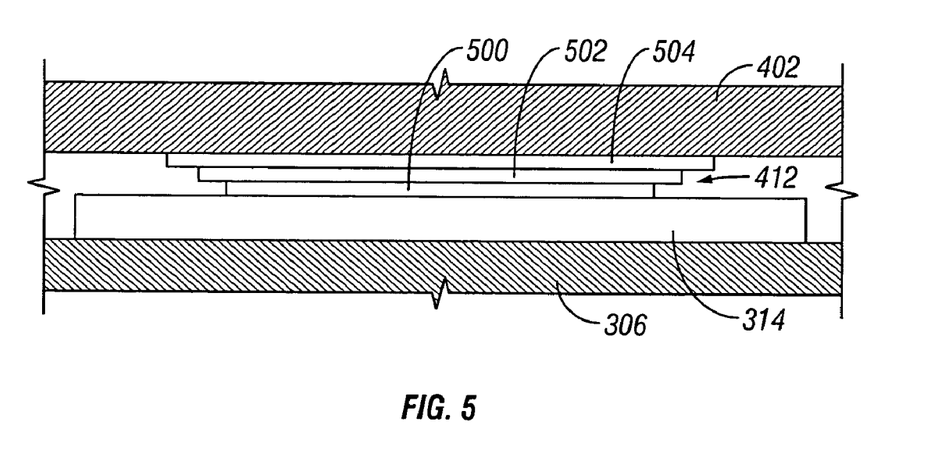
FIG. 5 illustrates a variation of the microprocessor cooling system of FIG. 4 according to one embodiment of the invention.

FIG. 5 illustrates an exemplary implementation of the thermal contact layer 412 according to embodiments of the invention. In general, the thermal contact layer 412 may be any suitable thermally conductive paste, foil (e.g., indium foil), epoxy and/or pad known to persons of ordinary skill in the art. However, because the distance between the microprocessor 314 and the bottom surface of the heat sink 402 is dictated by the fixed length of the standoffs 322', a somewhat taller than usual thermal contact layer 412 may be needed. Therefore, in some embodiments, the thermal contact layer 412 may be composed of three separate layers: a thermal paste layer 500, a copper or aluminum plate 502, and a thermal pad 504. The three layers together provide a thicker thermal contact layer 412 that provides consistent and reliable thermal contact between the microprocessor 314 and the heat sink 402.

Figure 6:
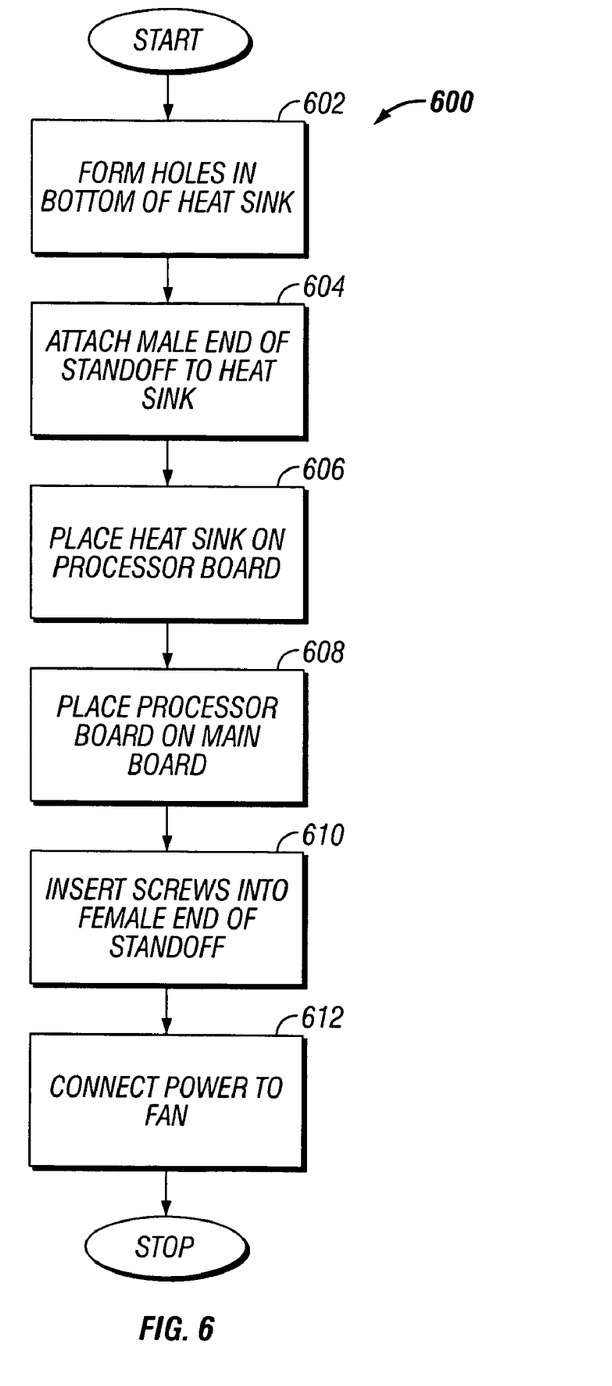
FIG. 6 illustrates a method of retrofitting a wagering game terminal with the microprocessor cooling system of FIG. 4 according to one embodiment of the invention.

FIG. 6 shows a method 600 of retrofitting a wagering game terminal with the microprocessor cooling system 400 according to embodiments of invention. The method 600 begins at step 602, where the holes 408 are formed (e.g., drilled) in the bottom of the heat sink 402. If the heat sink 402 and the fan 404 are not already attached, the fan 404 may be mounted on the heat sink 402 at this time. At step 604, the standoffs 322' are attached (e.g., screwed) to the heat sink 402 via the holes 408. At step 606, the heat sink 402 is placed on the processor board 306 over microprocessor 314 with the female end of the attached standoffs 322' on top of the spots where the screws 318 come through. The processor board 306 is then placed on the main board 304 at step 608, and the screws 318 are inserted through the main and processor boards 304 and 306 and screwed into the female end of the attached standoffs 322' at step 610. Finally, the fan 404 is connected to the electrical power supply of the wagering game terminal at step 612.

While the present invention has been described with reference to one or more particular embodiments, those skilled in the art will recognize that many changes may be made thereto without departing from the spirit and scope of the present invention. For example, although screws 318 are described herein, any suitable support member may be used in place of the screws, such as bolts, studs, rivets, and the like. In addition, although the microprocessor 314 was described as being mounted directly on the processor board 306, a socket may certainly be used for the microprocessor 314 without departing from the scope of the invention. And although the fan 404 was disclose as being mounted directly on top of the heat sink 402, it is possible to mount the fan 404 on the housing 302, somewhere else, or to have no fan at all, depending on the heat dissipation requirements of the particular application. Each of these embodiments and obvious variations thereof is contemplated as falling within the spirit and scope of the claimed invention, which is set forth in the following claims.

What is claimed is:

1. A microprocessor cooling system for a wagering game terminal, said wagering game terminal having a main board and a processor board, comprising:
   support members for maintaining appropriate spacing between said main board and said processor board, said main board controlling operation of said wagering game terminal and said processor board processing data for said wagering game terminal;
   a first heat sink having a plurality of fins and mounted to said processor board, said first heat sink in thermal contact with a microprocessor on said processor board and supported by said support members for spacing said heat sink apart from said processor board;
   a second heat sink spaced away from said first heat sink with no heat conductive pathway therebetween, said second heat sink having a plurality of fins and mounted in thermal contact with a chipset controller, said chipset controller mounted on said processor board proximate to said microprocessor; and
   a fan attached directly to said first heat sink, said fan directing air flow over said first and second heat sinks and drawing heat therefrom.

2. The microprocessor cooling system according to claim 1, wherein said support members are disposed on said main board and said processor board at locations originally designed to support a different microprocessor cooling system.

3. The microprocessor cooling system according to claim 1, wherein said heat sink is supported only by a subset of said support members.

4. The microprocessor cooling system according to claim 1, wherein said thermal contact is achieved via a thermally conductive layer sandwiched between said microprocessor and said first heat sink.

5. The microprocessor cooling system according to claim 4, wherein said thermally conductive layer includes one or more of a thermally conductive paste, a thermally conductive foil, a thermally conductive plate, and a thermally conductive pad.

6. The microprocessor cooling system according to claim 1, wherein said first heat sink is in direct thermal contact with said microprocessor.

7. The microprocessor cooling system according to claim 1, wherein each support member comprises a screw, a spacer disposed on said screw, and a standoff attached to said screw.

8. The microprocessor cooling system according to claim 1, wherein said microprocessor has a microprocessor footprint that is substantially equal to a first heat sink footprint for said first heat sink, and said chipset controller has a chipset controller footprint that is substantially equal to a second heat sink footprint for said second heat sink.

9. The microprocessor cooling system according to claim 1, wherein said fan further directs air to impinge on said first heat sink.

10. The microprocessor cooling system according to claim 1, wherein said second heat sink is mounted directly onto said chipset controller.

11. The microprocessor cooling system according to claim 1, further comprising a secondary fan spaced from said first and second heat sinks, said secondary fan directing air toward said main board and said processor board.

12. The microprocessor cooling system according to claim 1, wherein the first heat sink and the second heat sink have different sizes.

13. A wagering game terminal, comprising:
a wager input device for accepting a wager from a player at said wagering game terminal;
a display unit for displaying a wagering game of said wagering game terminal, said wagering game having an outcome that is randomly selected from a plurality of outcomes;
a first microprocessor and a second microprocessor for controlling said wager input device;
a microprocessor cooling system for cooling said first microprocessor and said second microprocessor, said microprocessor cooling system including a first heat sink that is in thermal contact with said first microprocessor, a second heat sink that is in thermal contact with said second processor, and a fan that is attached directly to said first heat sink and directs air flow over said first and second heat sinks and draws heat therefrom.

14. The wagering game terminal according to claim 13, wherein said microprocessor cooling system is originally designed for use in a personal computer.

15. The wagering game terminal according to claim 13, wherein said microprocessor cooling system is originally designed to be clipped on to said microprocessor or a socket of said microprocessor.

16. The wagering game terminal according to claim 13, wherein said microprocessor cooling system is mounted in said wagering game terminal without substantially changing a design of said wagering game terminal.

17. The wagering game terminal according to claim 13, said microprocessor performs said random selection of said outcome from a plurality of outcomes.

* * * * *